United States Patent [19]

Berthold et al.

[11] 4,242,697

[45] Dec. 30, 1980

[54] DIELECTRICALLY ISOLATED HIGH VOLTAGE SEMICONDUCTOR DEVICES

[75] Inventors: Joseph E. Berthold, Stirling; Adrian R. Hartman, New Providence; Peter W. Shackle, Bridgewater, all of N.J.

[73] Assignee: Bell Telephone Laboratories, Incorporated, Murray Hill, N.J.

[21] Appl. No.: 20,217

[22] Filed: Mar. 14, 1979

[51] Int. Cl.³ .................................................. H01L 27/04
[52] U.S. Cl. ...................................... 357/49; 357/52; 357/54; 357/58; 357/59
[58] Field of Search .................... 357/49, 52, 54, 59, 357/58

[56] References Cited

U.S. PATENT DOCUMENTS

| | | | |
|---|---|---|---|
| 3,411,051 | 11/1968 | Kilby | 357/49 |
| 3,858,237 | 12/1974 | Sawazaki et al. | 357/49 |
| 3,871,007 | 3/1975 | Wakamiya et al. | 357/49 |
| 3,967,309 | 6/1976 | Miyata et al. | 357/49 |
| 3,990,102 | 11/1976 | Okuhara | 357/49 |
| 4,001,873 | 1/1977 | Kajiwara et al. | 357/58 |
| 4,056,414 | 11/1977 | Kopp | 357/49 |
| 4,062,707 | 12/1977 | Mochizuki et al. | 357/59 |
| 4,079,506 | 3/1978 | Suzuki et al. | 357/49 |
| 4,084,986 | 4/1978 | Aoki et al. | 357/59 |
| 4,086,613 | 4/1978 | Biet | 357/59 |
| 4,114,254 | 9/1978 | Aoki et al. | 357/59 |
| 4,131,909 | 12/1978 | Matsada et al. | 357/49 |
| 4,176,372 | 11/1979 | Matsushita et al. | 357/42 |

Primary Examiner—William D. Larkins
Attorney, Agent, or Firm—Lester H. Birnbaum

[57] ABSTRACT

A structure for achieving closely spaced high voltage devices in integrated circuits. The devices are formed in single crystalline tubs (11) in a polycrystalline substrate (10). In order to prevent the potential of the substrate from causing breakdown of the devices, there is included between the single crystalline tubs and the polycrystalline substrate a semi-insulating layer (13) which has trapping states capable of taking on charge from the single crystalline region. The shielding provided by the semi-insulating layer permits the surface regions of the device to be made closer to the polycrystalline substrate and the tubs to be made more shallow.

17 Claims, 8 Drawing Figures

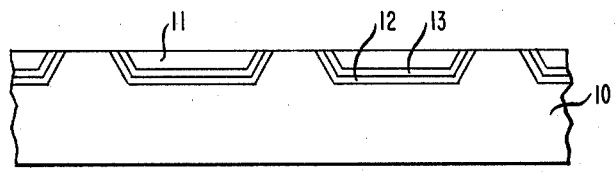
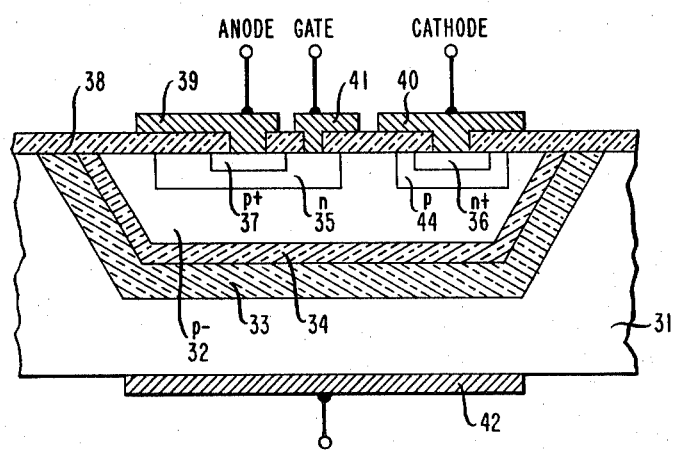
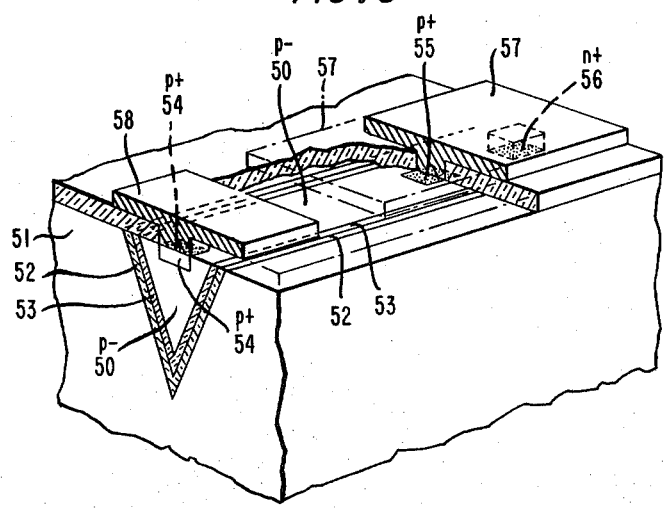

DIELECTRICALLY ISOLATED HIGH VOLTAGE SEMICONDUCTOR DEVICES

BACKGROUND OF THE INVENTION

This invention relates to high voltage semiconductor circuits and devices, and in particular to a dielectrically isolated structure which permits close packing of devices in a semiconductor substrate.

A great need is presently developing for integrated arrays of high voltage devices, such as in telephone crosspoint switching. Fabrication of such devices presents special problems due to the relatively high bias supplied to the devices. For example, it is known to fabricate devices utilizing localized surface regions in single crystalline silicon tubs situated in a polycrystalline substrate and to electrically isolate the tubs with a dielectric layer such as $SiO_2$ (see, for example, U.S. Pat. No. 3,411,051, issued to Kilby). While such structures are adequate, their use in high voltage applications results in certain problems. In particular, it is necessary to locate the surface regions of the devices sufficiently far removed from the polysilicon substrate so that the potential of the substrate will not cause breakdown. This has necessitated use of deep tubs (typically 45 μm deep for a device operating at 500 volts) with wide lateral dimensions (typically 55 μm from the surface region to the end of the tub) which has prevented fabrication of closely spaced structures.

It is therefore an object of the invention to provide a high voltage integrated circuit with a device structure which permits close spacing of devices.

SUMMARY OF THE INVENTION

This and other objects are achieved in accordance with the invention. The invention is an integrated circuit comprising a high voltage semiconductor device which includes a polycrystalline semiconductor substrate, a region of single crystalline semiconductor of one conductivity type formed at a major surface of the substrate and a localized region formed at the surface of the single crystalline region. The structure is characterized by the inclusion of a semi-insulating layer between the single crystalline region and the polycrystalline substrate. This semi-insulating layer is deigned to include trapping states which are capable of taking on charge from the single crystalline region. The semi-insulating layer therefore shields the localized surface region from the potential of the substrate when a bias is supplied thereto.

BRIEF DESCRIPTION OF THE DRAWING

These and other features of the invention are delineated in detail in the following description. In the drawing:

FIGS. 2-6 are cross-sectional views of a portion of an array of such devices during various stages of fabrication in accordance with the same embodiment;

FIG. 7 is a cross-sectional view of a device in accordance with a further embodiment of the invention; and FIG. 8 is a perspective view, partly cut away, of a device in accordance with a still further embodiment of the invention.

Figure 1:
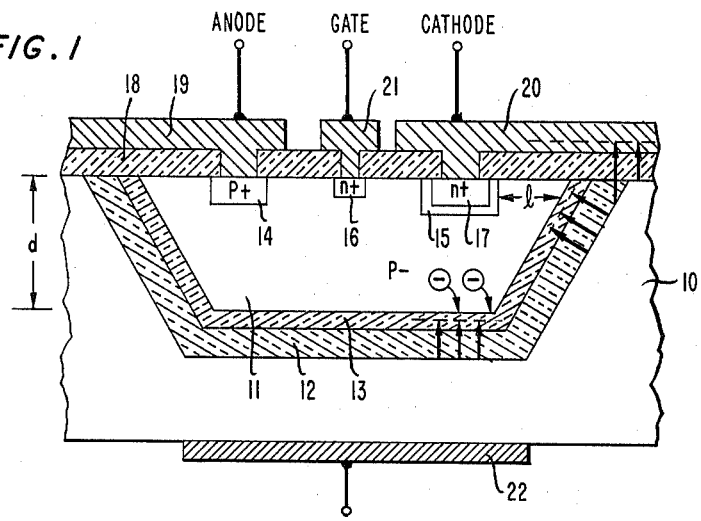
FIG. 1 is a cross-sectional, partly schematic, view of a device in accordance with one embodiment of the invention.
Figure 2:
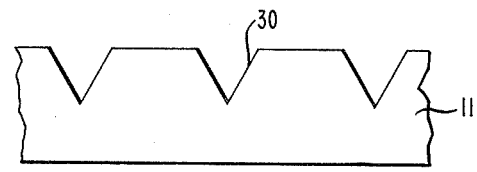

It will be realized that for purposes of illustration, these figures are not necessarily drawn to scale.

DETAILED DESCRIPTION

The invention will first be described with reference to the particular device illustrated in FIG. 1. It will be realized that this device is illustrative only, and the invention may be used for other high voltage devices as discussed below.

The particular device shown is a gated diode crosspoint switch which is described for example in U.S. patent applications of A. R. Hartman, et al, Ser. Nos. 972,056 and 972,021 filed Dec. 20, 1978. It includes a polycrystalline silicon substrate, 10, typically 500 μm thick with a single crystalline tub, 11, formed at a major surface of the substrate. The tub may typically have a length of 270 μm and a width of 120 μm at the surface. The bulk of the single crystalline tub is lightly doped with boron to a concentration of approximately $8 \times 10^{13}$ $cm^{-3}$ and is therefore designated p−. The tub is separated from the substrate by two layers. One layer, 12, is the standard dielectric layer such as $SiO_2$ with a thickness of approximately 2-4 μm. The second layer, 13, is a semi-insulating layer which has trapping states capable of taking on charge from the single crystalline tub and has a high dielectric strength. In this particular example, the layer comprises silicon which is doped with oxygen, wherein the oxygen concentration is approximately 25 atomic percent. The thickness of the layer is approximately 5000 Angstroms. The function of this layer will be described below.

The layer 13, as described herein is typically amorphous. However, depending on growth conditions the layer may be polycrystalline and should work in the same manner to be described. Although it has been taught to form oxygen-doped silicon layers on the surface of semiconductor devices (see, for example, U.S. Pat. No. 4,114,254 issued to Aoki, et al), it does not appear that anyone has previously suggested using such a layer as an intermediate layer between a single crystalline region and a polycrystalline substrate in accordance with the invention.

At the surface of the single crystalline tub, localized p+ region 14 and p region 15 are formed, typically by diffusion or ion implantation. Region 14 has a doping concentration near the surface of typically $10^{19}$ $cm^{-3}$ and has a doping distribution as a function of depth which follows a complementary error function. Region 15 typically has a concentration near the surface of $10^{18}$ $cm^{-3}$ and has a distribution following a Guassian profile. Both regions typically have depths of approximately 3 μm and have lengths of 100 μm and widths of 40 μm. The regions are placed approximately 170 μm apart and approximately 10 μm from the edge of the single crystalline tub.

Also, formed at the surface of the tub by diffusion or ion implantation are localized n+ regions 16 and 17. As shown, n+ region 16 is formed between regions 14 and 15, typically 70 μm from each. The region 16 typically has a depth of 10 μm, a length of 120 μm and a width of 30 μm.

N+ region 17 is formed within the area of p− region 15. This region typically has a depth of approximately 2 μm, a length of 80 μm and a width of 20 μm. The doping concentration of the n+ regions near the surface is typically $10^{19}$ $cm^{-3}$. The doping concentration of region 16 follows a Guassian profile, and that of region 17 follows a complementary error function.

An insulating layer, 18, such as SiO$_2$, is formed at the surface of the tub and substrate to passivate the device and provide insulation from the electrical contacts at the surface. The surface insulator may also comprise a multilayer of SiO$_2$ and Si$_3$N$_4$. Metal 19 which makes contact to the p+ region 14 constitutes the anode, while metal 20 which contacts n+ region 17 serves as the cathode. Metal, 21, which contacts the n+ region 16 comprises the gate electrode. A layer of silicon nitride (not shown) approximately 1.3 μm thick is usually formed over the top surface including the metals to retard corrosion. In addition, metal layer 22 makes contact to the polysilicon substrate 10. (It will be noted that the polysilicon substrate may also be contacted on the same major surface as the single crystalline regions.)

The gated diode switch operates between a high voltage blocking state and a low resistance conducting state. The blocking state is obtained when the gate voltage and substrate voltage are more positive by a voltage Vg than either the anode or cathode voltage. In the blocking state, a high voltage (typically +250 volts) is applied to the substrate through the contact 22 and to the gate contact 21, while a positive voltage of approximately +220 volts is applied to the anode contact 19 and a negative voltage of approximately −220 volts is applied to the cathode contact. The conducting state is obtained when the potential to the gate is removed and a potential difference of 1 volt exists between anode and cathode, in which case current is generated due to the flow of carriers laterally between p+ region 14 and n+ region 17. The current is turned off when the positive potential (+250 volts) is reapplied to the gate in order to collect electrons and deplete the single crystalline tub. The p region 15 keeps the depletion region produced by the gate from reaching the n+ region 17 and this prevents transfer of electrons from region 16 to region 17 during the blocking state. The blocking state also allows bilateral voltages with the anode at −220 volts and the cathode at +220 volts.

When the single dielectric layer 12 is utilized, it is possible for the electric field generated by the large potential difference between the substrate and surface region 15 to exceed the breakdown strength of single crystalline silicon (approximately $2 \times 10^5$ volts/cm). This is due in part to the light doping of single crystalline region 11. This result has necessitated, in the prior art, using a deep tub, typically d=45 μm, and also providing a large lateral distance, typically l=55 μm, between the localized surface regions 14 and 15 and the edge of the tub to insure that this critical field is not obtained.

FIG. 1 illustrates how the semi-insulating layer shields the localized surface region 15 from the potential of the substrate. Assuming for the sake of illustration that a bias is supplied only to electrodes 22 and 20, mobile electrons represented by "⊖" flow to the layer 13 and are captured by the trapping states to become fixed negative charge in the layer represented by "−". The layer 13 takes on just enough charge to reach the potential in the vicinity of surface region 15. This means that most of the lines of electric field, represented by arrows, will terminate at the semi-insulating layer and the field between the substrate and the region 15 essentially goes to zero. Thus, the negatively biased region 15 is effectively shielded from the potential of the substrate.

It will be realized that more than one potential is applied to the single crystalline tub, as when the anode is also biased. The semi-insulating layer will locally reach whatever the potential of the single crystalline region is in the vicinity at a particular time during operation. Thus, for example, on the left-hand portion of the device, when the anode is positively biased, the trapping states of the semi-insulating layer in that vicinity will capture negative charge until the layer reaches the potential of that region of the device. Less charge is captured in this portion since the voltage difference between the anode and substrate is much less than that between the region 15 and the substrate. This will not affect the shielding action in the vicinity of the cathode previously described.

It should also be realized that the device in FIG. 1 is typically coupled in anti-parallel with a similar device in the array to form a bidirectional switch with bilateral blocking. (For a more detailed discussion of such devices, see U.S. patent applications of A. R. Hartman, et al, Ser. Nos. 972,056 and 972,021 filed Dec. 20, 1978.) Thus, during portions of the operation, the localized region 14 will be biased negatively creating the same problem previously described. During such portions of the operation, the semi-insulating layer on the left-hand portion of the device will perform in the same manner as that described for the right-hand portion in FIG. 1. Thus, in general, the semi-insulating layer will shield any localized surface region biased with a polarity opposite to that of the substrate and thereby prevent any large electric field from being generated between the region and substrate so that no breakdown occurs.

As a result of the shielding, the distance, l, of the localized region from the edge of the single crystalline tub can be significantly reduced resulting in considerable reduction in device area. For example, in typical devices, this distance is now approximately 55 μm whereas with shielding the distance can be reduced to 10 μm or less. Furthermore, the depth of the single crystalline tub can be reduced, probably to approximately 20 μm for a 500 volt device.

A further advantage which accrues from the shielding action is the elimination of corner breakdown. This problem results from the negative potential of metal 20 and the positive potential of the substrate near the edges of the single crystalline regions. This creates a field from the substrate to the metal 20 across the corners of the tub which can exceed the critical field for breakdown of silicon. The shielding of the semi-insulating layer in accordance with the invention blocks the field as illustrated.

In order to provide shielding in accordance with the invention, the layer 13 should be semi-insulating, have trapping states which can take on charge from the single crystalline region, and have a high dielectric strength. In this example, the silicon semi-insulating layer preferably has an oxygen concentration in the range 10–40 atomic percent and a thickness within the range 0.05–5 μm to provide adequate shielding when a dielectric layer (12) is also utilized. The dielectric strength is typically in excess of $2 \times 10^5$ volts/cm. In general, proper shielding should result for any semi-insulating layer with trapping states capable of taking on charge from the single crystalline region in an amount of at least $5 \times 10^{11}$ electronic charges/cm$^2$. The resistivity of the semi-insulating layer should be sufficiently great so that there is little lateral current in the layer in relation to the lateral current of the device. Preferably, the resistivity is within the range $10^4$–$10^{12}$ ohm-cm.

Trapping states are created in semiconductor layers by disorder in the crystal structure or by doping the layer. Thus, most polycrystalline semiconductors such as polycrystalline silicon and GaAs should provide sufficient trapping states to be used in accordance with the invention without the requirement of any dopant impurities. In addition, semiconductor layers doped with impurities other than oxygen may also be utilized. For example, amorphous or polycrystalline silicon doped with nitrogen, or GaAs doped with chromium are likely alternatives to the oxygen-doped silicon described above.

The minimum concentration of trapping states needed for shielding will basically be a function of the potential difference generated between the substrate and surface regions and the thickness of the dielectric layer 12. For example, for a 500 volt device with a dielectric layer thickness of 1 $\mu$m, a minimum concentration of approximately $1 \times 10^{13}$ cm$^{-2}$ would be needed to shield the entire potential. For a 4 $\mu$m thick layer of dielectric, a minimum concentration would be approximately $2.5 \times 10^{12}$ cm$^{-2}$. The requirements for various other parameters can be easily calculated according to standard capacitance theory.

Although a 500 volt device has been described, the invention would be useful in general for devices operated at 30 volts or more. The invention could be used in any such device employing lateral conduction and a lightly doped single crystalline region, i.e., one having a doping concentration of less than $10^{16}$ cm$^{-3}$.

A typical fabrication sequence for an array of such devices is illlustrated in FIGS. 2–6 wherein elements corresponding to those of FIG. 1 are similarly numbered. A wafer of single crystalline silicon 11 is provided with a thickness of approximately 500 $\mu$m and typically having major surfaces lying in the (100) plane. V-shaped grooves 30 are etched into one surface of the wafer to a depth of approximately 70 $\mu$m. The usual etchant is a mixture of potassium hydroxide and water and a useful etching mask (not shown) is a layer of thermally grown SiO$_2$.

Figure 3:
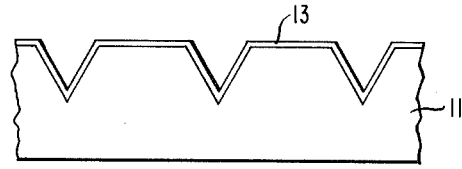

Next, as shown in FIG. 3, the semi-insulating layer 13 is formed on the surface including the walls of the grooves. Advantageously, the layer can be formed by standard chemical vapor deposition. For example, the wafer may be placed in a deposition chamber and heated to a temperature of approximately 650 degrees. Reactant gases of silane and nitrous oxide can be caused to flow over the wafer with a nitrogen carrier gas. Silicon doped with oxygen will then be deposited on the surface including the walls of the groove at a rate of approximately 100 Angstroms per minute. To achieve a 20 percent doping with oxygen, the relative amounts of gases are 3 parts silane to 1 part nitrous oxide and the total flow rate is approximately 250 cm$^3$/min.

Figure 4:
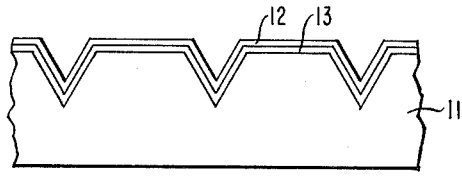

Next, as shown in FIG. 4, a layer of SiO$_2$, 12, is deposited over the semi-insulating layer. This can be done, for example, by chemical vapor deposition using silane and oxygen as reactant gases with a nitrogen carrier gas. The wafer is typically heated to a temperature of 400 degrees C. and the relative amounts of gases are 1 part silane to 9 parts nitrous oxide. The total flow rate is 580 cm$^3$/min. The deposition rate of SiO$_2$ is approximately 120 Angstroms/min.

Figure 5:
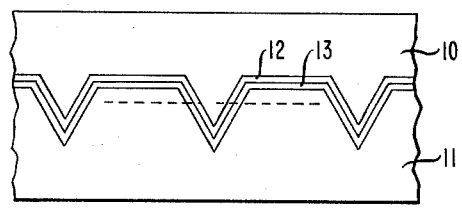

Then, as shown in FIG. 5, the polycrystalline silicon substrate, 10, is formed by deposition over the SiO$_2$ layer. This is typically accomplished in two stages. First, in order to cause nucleation of the polycrystalline silicon, a reactant gas of silane with a carrier gas of hydrogen is caused to flow over the structure which is heated to a temperature of approximately 1000° C. for a time of approximately 10 min. This produces a polycrystalline film which is typically several microns thick. Then, a reactant gas of trichlorosilane (SiHCl$_3$) with a hydrogen carrier gas is caused to flow over the resulting structure which is heated to a temperature of approximately 1190° C. The rate of deposition of polycrystalline silicon for this process is approximately 7 $\mu$m/min. Deposition continues until more than 500 $\mu$m of polycrystalline silicon is formed. The surface of the polycrystalline layer is then planarized by grinding.

The single crystalline wafer is then ground and polished down to the line indicated so as to expose portions of the polycrystalline silicon in the grooves. The resulting inverted structure is shown in FIG. 6. It will be noted that individual tubs of single crystalline silicon 11 are therefore formed in one major surface of the polycrystalline silicon substrate 10 and electrically isolated therefrom by the layers 12 and 13. The particular device configurations, such as that shown in FIG. 1, can then be formed in the single crystalline tubs.

One alternative device configuration which may also utilize the present invention is illustrated in FIG. 7. This is an example of a standard integrated silicon controlled rectifier. As in the case of the gated diode switch, the structure includes a polycrystalline silicon substrate 31 with a tub 32 of single crystalline silicon formed in a major surface. Again, the tub is electrically insulated from the substrate by a dielectric layer, 33, and between this layer and the tub is a semi-insulating layer 34 in accordance with the present invention.

In this example, the tub 32 is again doped to produce p$^-$ conductivity type with an impurity concentration of typically $0.5$–$5 \times 10^{14}$ cm$^{-3}$. N-type region 35 and n$^+$ region 36 are formed at the surface of the single crystalline region by standard diffusion or ion implantation. The n region 35 typically has a doping concentration following a Guassian profile and a surface concentration of approximately $10^{18}$ cm$^{-3}$ and the n$^+$ type region 36 has a doping concentration following a complementary error function and a surface concentration of $10^{19}$ cm$^{-3}$. P$^+$ type region, 37, is formed within n-type region 35, again, by diffusion or ion implantation. This region typically has an impurity concentration following a complementary error function and a surface concentration of approximately $10^{19}$ cm$^{-3}$. P-type region 44 is formed surrounding n$^+$ region 36 to prevent punch through and typically has a concentration following a Guassian profile and a surface concentration of $10^{18}$ cm$^{-3}$. Insulating layer 38 is formed on the surface of the single crystalline region and polycrystalline substrate. Metal 39 makes contact to the p$^{30}$ region 37 and constitutes the anode, while metal 40 contacts the n$^+$ region 36 and constitutes the cathode. Metal 41 makes contact to n region 35 and constitutes the gate electrode. Contact is made to the substrate by means of metal 42. The operation of such a device is well known and will not be discussed. For purposes of the present invention, it will be noted that this device also conducts laterally (between p$^+$ region 37 and n$^+$ region 36) when an appropriate bias is supplied to the cathode, anode and gate electrodes. Again, in order to reduce the device area, it is necessary to shield the surface regions, in this case n region 35 and p-region 44, from the potential of the polycrystalline substrate. This is accomplished by the semi-insulating layer, 34, in the manner previously described.

The invention could also be used to reduce the size of other components typically used in a semiconductor array forming a high voltage integrated circuit. For example, FIG. 8 illustrates a standard pinched resistor used for high voltage applications. Portions of the surface oxide and electrodes are shown as transparent for the sake of illustration. The resistor is formed in a region, 50, of single crystalline silicon having a p-conductivity type. Again, the single crystalline region is formed at a surface of a polycrystalline silicon substrate 51 and separated therefrom by dielectric layer 52 and semi-insulating layer 53 in accordance with the invention. Localized p+ regions 54 and 55 are formed in the surface of the single crystalline region by standard ion implantation or diffusion. Localized n+ region, 56, is formed in the surface of the single crystalline region adjacent to region 55 and electrically coupled thereto by means of electrode 57. Electrode 58 makes electrical contact to region 54. When a sufficient positive potential is applied to electrode 57 (typically +250 volts) and negative potential to electrode 58 (typically −220 volts), the device will operate as a standard pinched resistor with lateral conduction between the p+ regions (n+ region 56 serves to collect electrons from the p− region 50). As before, by shielding the localized surface region (in this case the negatively biased region 54) from the effects of the polycrystalline substrate potential, the distance of the surface regions to the edge of the tub and the thickness of the tub can be made considerably smaller to conserve space. With pinched resistor structures, this provides the additional advantages of low limiting current since it is easier to deplete the smaller single crystalline volume. Further, the variable resistor characteristics which can result from variable charge in the dielectric 52 are avoided by use of the semi-insulating layer 53.

Further device modifications are possible consistent with the invention. For example, by making the semi-insulating layer thicker (approximately 5–20 $\mu$m) it may perform the additional function of electrically insulating the single crystalline region and thus use of the dielectric layer might be eliminated to reduce processing steps. With such a structure, it might also be possible to eliminate the nucleation step required for polycrystalline silicon deposition. It may also be desirable to incorporate a very thin layer (of the order of 70 Angstroms) of $SiO_2$ between the semi-insulating layer and the single crystalline region to reduce surface recombination at the interface. Alternatively, it may be desirable to anneal the semi-insulating layer in an $H_2$ environment to reduce surface recombination. Further, it may also be desirable to form the semi-insulating layer at only portions of the interface between the single crystalline tub and the polycrystalline substrate. For example, if the semi-insulating layer is formed only between the side walls of the tub and the substrate, and not at the bottom of the tub, possible surface recombination in the area at the bottom caused by the semi-insulating layer could be eliminated. In such cases, shielding at the bottom of the tub could be provided with a sufficiently deep tub while preserving the advantage of bringing the localized surface regions closer to the edge of the tub. It will be understood that the appended claims include such embodiments where the layer is formed in selective areas of the interface unless specifically provided otherwise. It will also be noted that in the particular devices illustrated, all polarities shown could be reversed, and, in addition, several other types of device structures may utilize the present invention.

Various additional modifications will become apparent to those skilled in the art. All such variations which basically rely on the teachings through which the invention has advanced the art are properly considered within the spirit and scope of the invention.

We claim:

1. An integrated circuit including a high voltage semiconductor device comprising a polycrystalline semiconductor substrate (10), a region of single crystalline semiconductor (11) the bulk of which has a first conductivity type formed at a major surface of said substrate, and a localized region (e.g., 15,) formed at the surface of said single crystalline region, characterized in that said device further comprises a semi-insulating layer (13) between said substrate and single crystalline region, said semi-insulating layer having trapping states capable of taking on charge from said single crystalline region and thereby shield said localized surface region from the potential of the substrate when a bias is supplied thereto.

2. The circuit according to claim 1 wherein the localized surface region (16, 17) has a conductivity type opposite to that of the bulk of said single crystalline region.

3. The circuit according to claim 1 wherein the localized surface region (14, 15) has the same conductivity type as the bulk of said single crystalline region but a higher impurity concentration.

4. The circuit according to claim 1 wherein the doping concentration of the bulk of the single crystalline region is less than $10^{16}$ cm$^{-3}$.

5. The circuit according to claim 1 further comprising a dielectric layer (12) disposed between the substrate and the semi-insulating layer.

6. The circuit according to claim 1 wherein the thickness of the semi-insulating layer is within the range 0.05–20 $\mu$m.

7. The circuit according to claim 1 wherein the dielectric strength of the semi-insulating layer is greater than $2 \times 10^5$ volts/cm.

8. The circuit according to claim 1 wherein the resistivity of the semi-insulating layer is within the $10^4$–$10^{12}$ ohm-cm.

9. The circuit according to claim 1 wherein the concentration of trapping states in the layer is sufficient to take on charge from the single crystalline region in an amount of at least $5 \times 10^{11}$ electronic charges/cm$^2$.

10. The circuit according to claim 1 wherein the semi-insulating layer comprises silicon doped with oxygen.

11. The circuit according to claim 10 wherein the doping concentration of oxygen lies within the range 10–40 atomic percent.

12. The circuit according to claim 1 wherein the semi-insulating layer is formed selectively between the side walls of the single crystalline region and the substrate.

13. The circuit according to claim 1 wherein there is included at the surface of said single crystalline region first and second localized regions (14 and 15) of the same conductivity type but higher doping concentration than the bulk of the single crystalline region, a third localized region (16) of opposite conductivity type disposed between the first and second regions, a fourth localized region (17) formed within the boundaries of the second region, electrical contacts to said first and fourth regions (19 and 20) and a gate electrode making electrical contact to the third region to form a gated diode switch in the single crystalline region.

14. The circuit according to claim 1 wherein there is included at the surface of said single crystalline region a first localized region (37 of FIG. 7) of the same conductivity type but higher doping concentration than the bulk of the single crystalline region, a second localized region (35) of opposite conductivity type surrounding said first region, a third localized region (36) of opposite conductivity type spaced from said first and second regions, a fourth localized region of the same conductivity type but higher doping concentration than the bulk of the single crystalline region surrounding said third localized region, electrical contacts (39 and 40) to said first and third regions, and a gate contact (41) to said second region to form a controlled rectifier in said single crystalline region.

15. The circuit according to claim 1 wherein there is formed at the surface of the single crystalline region first and second localized regions (54 and 55 of FIG. 8) of the same conductivity type but higher doping concentration than the bulk of the single crystalline region, a third localized region (56) of opposite conductivity type which is electrically coupled to said second localized region, and electrical contacts to said regions so as to form a pinched resistor in said single crystalline region.

16. A high voltage semiconductor device comprising a polycrystalline silicon substrate (10), a region of single crystalline silicon (11) the bulk of which has a first conductivity type and a doping concentration of less than $1 \times 10^{16}$ cm$^{-3}$ formed at a major surface of said substrate, a localized region (e.g., 15) formed at the surface of said single crystalline region, and a dielectric layer (12) separating said single crystalline region from said substrate, characterized in that said device further comprises between the dielectric layer and the single crystalline region a layer (13) having a thickness of 0.05–5 μm comprising silicon which is doped with oxygen to a concentration of 10–40 atomic percent so as to form trapping states in said layer capable of taking on charge from said single crystalline region and thereby shield said localized surface region from the potential of the substrate when a bias is supplied thereto.

17. A high voltage semiconductor device comprising a polycrystalline silicon substrate (10), a region of single crystalline silicon (11) the bulk of which has a first conductivity type with a doping concentration of less than $1 \times 10^{16}$ cm$^{-3}$ formed at a major surface of said substrate, first and secod localized regions (14 and 15) formed at the surface of the single crystalline region having the same conductivity type but higher doping concentration than the bulk of the single crystalline region, a third localized region (16) of opposite conductivity type formed at the surface of the single crystalline region between the first and second regions, a fourth localized region (17) of opposite conductivity type formed at the surface of the single crystalline region within the boundaries of the second region, electrical contacts to said first and fourth regions (19 and 20), a gate electrode (21) which makes electrical contact to the third region and a dielectric layer (12) comprising SiO$_2$ separating said single crystalline region from said substrate characterized in that said device further comprises between the dielectric layer and the single crystalline region a layer (13) having a thickness of 0.05–5 μm comprising silicon doped with oxygen to a concentration of 10–40 atomic percent to produce a layer having a dielectric strength of greater than $2 \times 10^5$ volts/cm, and trapping states capable of taking on charge from said single crystalline region in excess of $5 \times 10^{11}$ electronic charges/cm$^2$ and thereby shield the localized surface regions from the potential of the substrate when a bias is supplied thereto.

* * * * *